United States Patent
McCollum et al.

(10) Patent No.: US 9,275,990 B2
(45) Date of Patent: Mar. 1, 2016

(54) CIRCUIT AND METHOD FOR REDUCING BVII ON HIGHLY OVERDRIVEN DEVICES

(71) Applicant: Microsemi SoC Corporation, San Jose, CA (US)

(72) Inventors: John L. McCollum, Orem, UT (US); Fethi Dhaoui, Mountain House, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/703,710

(22) Filed: May 4, 2015

(65) Prior Publication Data
US 2015/0318278 A1    Nov. 5, 2015

Related U.S. Application Data

(60) Provisional application No. 61/988,610, filed on May 5, 2014.

(51) Int. Cl.
| | |
|---|---|
| *H01L 23/62* | (2006.01) |
| *H01L 27/06* | (2006.01) |
| *H01L 49/02* | (2006.01) |
| *H01L 29/08* | (2006.01) |
| *H01L 29/10* | (2006.01) |

(52) U.S. Cl.
CPC ............ *H01L 27/0629* (2013.01); *H01L 28/20* (2013.01); *H01L 29/0847* (2013.01); *H01L 29/1079* (2013.01)

(58) Field of Classification Search
CPC ............ H01L 27/0251; H01L 27/0629; H01L 27/0255; H01L 29/0847; H01L 29/1078
USPC .......................................................... 257/363
See application file for complete search history.

(56) References Cited

U.S. PATENT DOCUMENTS

2014/0198416 A1*   7/2014   Karp .................... H01L 27/0251
                                                                    361/56

* cited by examiner

*Primary Examiner* — Trung Q Dang
(74) *Attorney, Agent, or Firm* — Leech Tishman Fuscaldo & Lampl; Kenneth D'Alessandro, Esq.

(57) ABSTRACT

An integrated circuit is formed on a p-type semiconductor substrate connected to ground potential. A deep n-well is disposed in the p-type substrate. A p-well is disposed in the deep n-well. An n+ drain region and an n+ source region are disposed in the p-well, the n+ source region connected to a common potential. A p-type contact is disposed in the p-well and is connected to ground potential through a resistor.

12 Claims, 2 Drawing Sheets

US 9,275,990 B2

CIRCUIT AND METHOD FOR REDUCING BVII ON HIGHLY OVERDRIVEN DEVICES

CROSS-REFERENCE TO RELATED APPLICATIONS

This application claims the benefit of U.S. Provisional Patent Application No. 61/988,610, filed May 5, 2014, the contents of which are incorporated in this disclosure by reference in their entirety.

BACKGROUND OF THE INVENTION

1. Field of the Invention

The present invention relates to integrated circuit technology. More particularly, the present invention relates to submicron integrated circuit technology.

2. Description of Related Art

Impact ionization is the process in a material by which one energetic charge carrier can lose energy by the creation of other charge carriers. In semiconductors an electron, or hole, with enough kinetic energy can knock a bound electron from its bound state in the valence band and promote it to a state in the conduction band, creating an electron-hole pair. If this occurs in a region of high electrical field it may result in avalanche breakdown.

With extreme submicron integrated circuits it is very difficult to add additional transistors optimized for different power supply voltages. Current field programmable gate arrays (FPGAs) require 3.3 volt, 2.5 volt, 1.8 volt and 1.05 volt transistor devices, when only two optimized transistors are available. The prior-art solution to provide transistors optimized for different power supply voltages has been to overdrive the oxides and use lightly doped drains to achieve the desired breakdown voltages. This does not however address the energetic, or hot, electrons generated when the transistor switches and therefore passes through the breakdown voltage from impact ionization (BVii) region in the vicinity of the drain.

As described above, the basic problem is caused by hot carriers being accelerated by a high electric field in the oxide that causes the carriers to impact the $SiO_2$ bonds of the oxide used to isolate the gate with enough energy to break the bonds of the oxide thereby damaging the oxide and allowing even more current to flow which can result in a runaway condition.

The hot carriers are caused by a high voltage on the drain of a transistor with the gate electrode grounded, the high voltage being close to the junction breakdown voltage. The grounded gate pinches off the electric field extending from the gate, causing electron leakage current at the surface of the device, i.e., the area between the drain and the transistor channel at the interface between the silicon and the gate oxide. The leakage current is commonly referred to as Bvii, and supplies a large number of hot electrons and hot holes. The hot holes are accelerated toward the most negative potential, i.e. the grounded gate. As the junction field between the n+ source/drain regions and the p-well containing them gets high enough, the leakage carriers gain enough energy to knock more electron hole pairs free causing leakage multiplication. These carriers have enough energy to get into the conduction band in the oxide and cause damage.

The gate structure exhibits an $Si/SiO_2$ interface where the gate isolation oxide is adjacent the p-well channel area, and has an abrupt transition including dangling bonds and changing band structure. As a result there are a large number of traps at the interface. Electrical stressing can break bonds between Si and O of the oxide at the interface, leaving a dangling bond. The dangling bonds give rise to allowed states in the bandgap (traps) which can trap electrons and holes. Electrical stressing can also release hydrogen at the interface. Atomic hydrogen is generally used to passivate the interface traps. It is introduced after metallization through an anneal in forming gas and passivates the traps by forming Si—O—H type bonds. However, these bonds are very weak and can be easily broken by hot carriers. Hydrogen can also come from various other processing steps, e.g., plasma CVD and LPCVD of $SiO_2$ and $Si_3N_4$.

Several models have been developed by different researchers to explain the oxide degradation and breakdown of the $SiO_2$. If the electric field is sufficiently high, Fowler-Nordheim tunneling or hot carrier injection of electrons occurs into the conduction band of the oxide. The electrons gain energy from the electric field and lose it through lattice scattering. Some of these electrons lose all of the excess energy and get trapped in the oxide if traps are present in it. Many electrons continue to conduct in the conduction band of the oxide and in the process lose the excess energy through lattice scattering, which can cause damage to the bonds of the $SiO_2$ lattice.

Electrical stressing can cause impact ionization at the $Si/SiO_2$ interface, generating more hot electrons and hot holes. Hot holes can then be injected in the valance band of $SiO_2$ via Fowler-Nordheim tunneling. Similar to the case of electrons, the holes also cause further damage through trap creation and trapping. Another model states that the high electric field itself may polarize the bonds and ultimately break them under a combination of electrical stress and thermal energy imparted to them.

All of these models agree that the damage is caused by bond breaking. Trapped charge causes changes in device properties as described earlier. However, if the damage is excessive, oxide breakdown occurs. Since the breakdown is accompanied with physical damage, it is not reversible.

This aspect of the device reliability has been tolerated with ever increasing transistor degradation, and is one of the major contributors to the lifetime reduction of integrated circuits in general and FPGAs specifically.

SUMMARY OF THE INVENTION

By adding an appropriate resistance to the body of a transistor the BVii generation can be reduced by dynamically reducing the drain-to-bulk voltage. In integrated circuits where the n-channel transistor is formed directly in the substrate this would be a problem, but modern processes allow providing an isolated transistor body by placing a deep n-well under the p-well thereby isolating the transistor body from the substrate. The transistor body can then be connected to the power supply through a resistor. By making the p-well high impedance, such that when the BVii condition begins to supply current, the well side of the drain junction increases voltage closer to the drain, thus reducing the BVii condition. If the drain voltage continues to rise, the well will eventually forward bias the source and begin to supply current to the drain via a bipolar turn-on condition which typically does not damage the gate oxide as the current is deep in the silicon away from the gate oxide.

BRIEF DESCRIPTION OF THE DRAWING(S)

DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
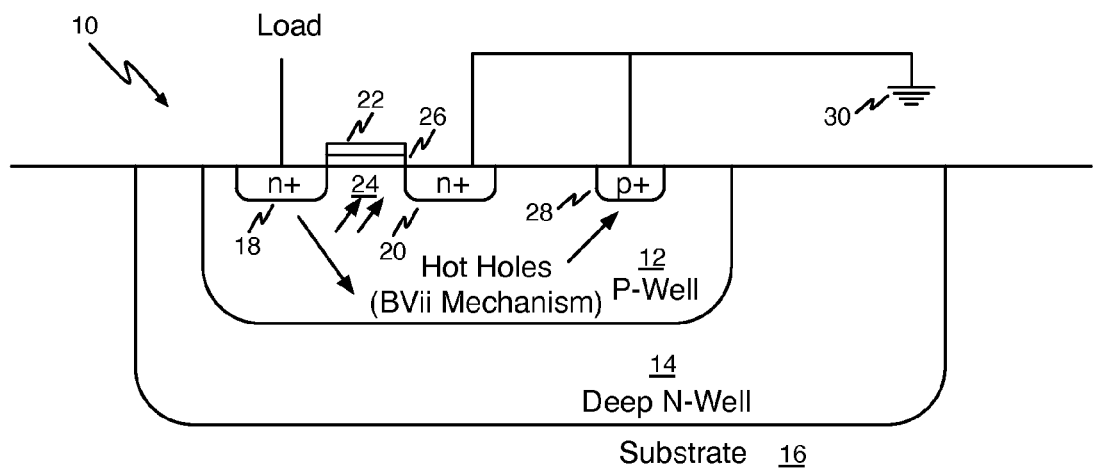
FIG. 1 is a cross-sectional view of an n-channel MOS transistor in a p-well in an integrated circuit, illustrating the problem solved by the present invention.

Referring first to FIG. 1, a cross-sectional view of an n-channel MOS transistor 10 formed in a p-well 12 in an integrated circuit illustrates the problem solved by the present invention. The BVii mechanism is illustrated in FIG. 1. P-well 12 is formed in deep n-well 14. Deep n-well 14 is formed in semiconductor substrate 16.

Transistor 10 includes n+ drain 18 and n+ source 20. Gate 22 is disposed above a channel 24 between drain 18 and source 20. A layer of gate oxide 26 separates gate 22 from the channel 24 formed between drain 18 and source 20.

A load is coupled to the drain 18. Source 20 and a p-well contact diffusion 28 are coupled to a common potential, referred to for simplicity as ground, i.e., the negative end of the power supply, indicated at reference numeral 30. The doping of p-well contact diffusion 28 is typically a p+ value for low resistance.

The voltage at the drain 18 of the n-channel transistor 10 creates an electric field at the junction between the drain 18 of the n-channel transistor 10 and the p-well 12 in which it is formed. This creates leakage carriers in the region of the junction which are ultimately drawn out at p-well contact diffusion 28. As the electric field at the junction between the drain 18 of the n-channel transistor and the p-well 12 in which it is formed increases with increasing drain voltage, the leakage carriers gain enough energy to dislodge more electron/hole pairs, thus multiplying the leakage current. These "hot" carriers are illustrated by arrows in FIG. 1. The energy of these electron/hole pairs can become high enough to enter the conduction band of the gate oxide 26 and cause damage as noted above.

Figure 2:
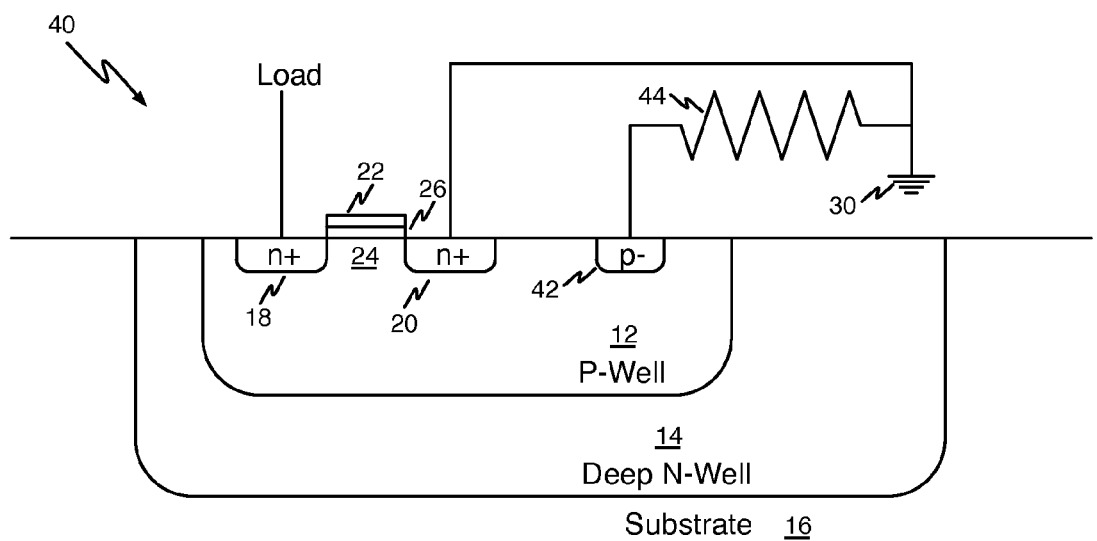
FIG. 2 is a cross-sectional diagram of n-channel MOS transistor in a p-well in an integrated circuit, the p-well disposed in a deep n-well and coupled to a common potential through a resistor in accordance with one aspect of the present invention.

Referring now to FIG. 2, a cross-sectional view of an n-channel MOS transistor 40 according to the present invention. Features of the transistor 40 in FIG. 2 that correspond to features in FIG. 1 are identified by the same reference numerals used in FIG. 1 for those features.

MOS transistor 40 is formed in a p-well 12. P-well 12 is formed in deep n-well 14. Deep n-well 14 is formed in semiconductor substrate 16.

Transistor 40 includes n+ drain 18 and n+ source 20. Gate 22 is disposed above a channel 24 between drain 18 and source 20. A layer of gate oxide 26 separates gate 18 from the channel 24 formed between drain 18 and source 20.

A load is coupled to the drain 18. Source 20 is coupled to ground (the negative end of the power supply) indicated at reference numeral 30. In accordance with one aspect of the present invention, a p-well contact diffusion 42, with doping "p−" is coupled to ground 30 through a resistor 44. The p-well contact diffusion 42 may be doped from about $1\times10^{15}$ to about $1\times10^{16}$ atoms/cm$^3$ to form a small high-resistance isolated p− area and thus make a very high value resistor in a small space between the body contact and the actual body of the transistor, and in such an embodiment resistor 44 is thus formed by the low doping. Resistor 44 may also be formed, for example, by making the p-well contact diffusion 42 long and narrow e.g., 1 micron long and 1 micron wide by 1 micron deep at a resistivity level of about 10 ohm-cm, or by forming it as a polysilicon resistor or by other technologies as will be appreciated by persons of ordinary skill in the art. An additional external resistor may be optionally supplied as illustrated, and described further below in relation to FIG. 3. Resistor 44, which as indicated may be the resistance of p-well contact diffusion 42 and may optionally include an additional resistor, may have a resistance value of from about 100kΩ to about 500kΩ. A presently preferred value is about 300kΩ.

By making the impedance from the p-well 12 to ground, or alternately to the source 20, a high impedance (about 100kΩ or greater, when the BVii condition begins to supply current, the voltage at the p-well side of the drain junction increases, thus reducing the BVii condition, since as the hot carriers exit via p-well contact diffusion 42, they cause a current to flow through resistor 44, and the potential of p-well 12 rises from ground towards the potential of drain 18. If the drain voltage continues to rise, the p-well potential will continue to rise until it becomes forward biased in relation to the source 20 and begins to supply current to the drain 18 via a turn-on condition of the lateral bipolar transistor formed from the source 18 (the emitter), drain 20 (the collector), and p-well 12 (the base), which typically does not damage the gate oxide as the current is deep in the silicon away from the gate oxide.

Figure 3:
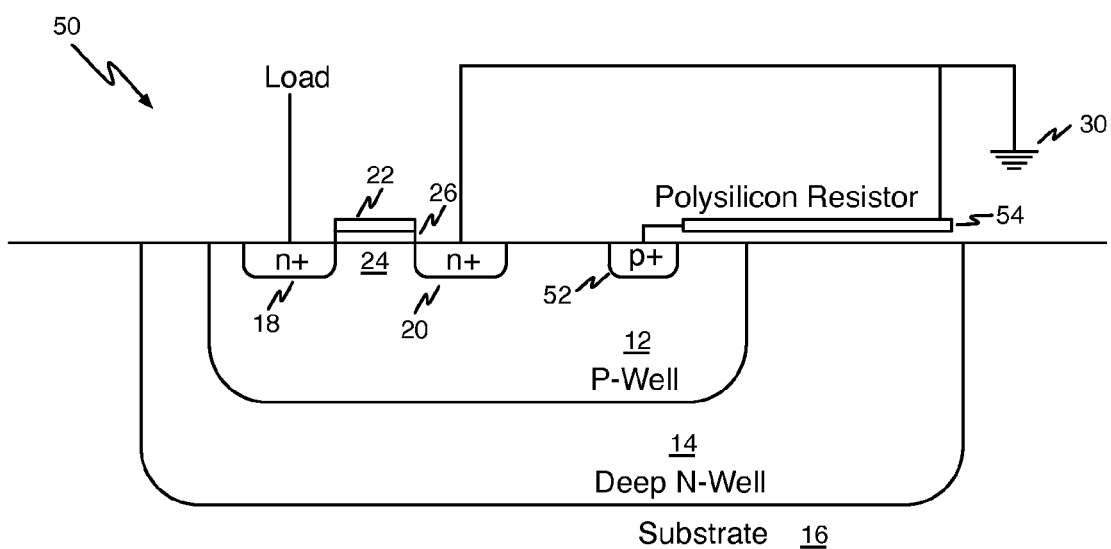
FIG. 3 is a cross-sectional diagram of n-channel MOS transistor in a p-well in an integrated circuit, the p-well disposed in a deep n-well and coupled to a common potential through a polysilicon resistor in accordance with another aspect of the present invention.

Referring now to FIG. 3, a cross-sectional view of an n-channel MOS transistor 50 according to the present invention. Features of the transistor 50 in FIG. 3 that correspond to features in FIGS. 1 and 2 are identified by the same reference numerals used in FIGS. 1 and 2 for those features.

MOS transistor 50 is formed in a p-well 12. P-well 12 is formed in deep n-well 14. Deep n-well 14 is formed in semiconductor substrate 16.

Transistor 50 includes n+ drain 18 and n+ source 20. Gate 22 is disposed above a channel 24 between drain 18 and source 20. A layer of gate oxide 26 separates gate 18 from the channel 24 formed between drain 18 and source 20.

A load is coupled to the drain 18. Source 20 is coupled to ground, or to the negative end of the power supply, indicated at reference numeral 30. In accordance with one aspect of the present invention, a p-well contact diffusion 52, which may be doped to either "p+" or to "p−" is coupled to ground 30 through a polysilicon resistor 54. P-well contact diffusion 52 may be doped from about $1\times10^{15}$ to about $1\times10^{16}$ atoms/cm$^3$ to form a small high-resistance isolated p− area that is in series with the polysilicon resistor 54. Alternately, p-well contact diffusion 52 used in this embodiment may be doped to at least about $1\times10^{19}$ atoms/cm$^3$ or greater to form a low resistance p+ contact diffusion. Resistor 52 may have a resistance value of from about 100kΩ to about 500kΩ. A presently preferred value is about 300kΩ.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. An integrated circuit comprising:
   a p-type semiconductor substrate connected to ground potential;
   a deep n-well disposed in the p-type substrate;
   a p-well disposed in the deep n-well;

an n+ drain region and an n+ source region disposed in the p-well, the n+ source region connected to a common potential;

a p-type contact disposed in the p-well and arranged to connect the p-well to the common potential through a resistor having a resistance of between about 100 kΩ and about 500 kΩ.

2. The integrated circuit of claim 1 wherein the p-type contact is p- doped to form the resistor.

3. The integrated circuit of claim 1 wherein the resistor has a resistance of about 300 kΩ.

4. The integrated circuit of claim 1 wherein the p-type contact is formed as a long and narrow region to form the resistor.

5. The integrated circuit of claim 4 wherein the resistor has a resistance of between about 100 kΩ and about 500 kΩ.

6. The integrated circuit of claim 5 wherein the resistor has a resistance of about 300 kΩ.

7. The integrated circuit of claim 1 wherein the resistor is a polysilicon resistor.

8. The integrated circuit of claim 7 wherein the resistor has a resistance of between about 100 kΩ and about 500 kΩ.

9. The integrated circuit of claim 8 wherein the resistor has a resistance of about 300 kΩ.

10. The integrated circuit of claim 1 wherein the p-type contact is p- doped and is in series with a polysilicon region to form the resistor.

11. The integrated circuit of claim 10 wherein the resistor has a resistance of between about 100 kΩ and about 500 kΩ.

12. The integrated circuit of claim 11 wherein the resistor has a resistance of about 300 kΩ.

\* \* \* \* \*